US012677383B2

(12) United States Patent
Honda

(10) Patent No.: US 12,677,383 B2
(45) Date of Patent: Jul. 7, 2026

(54) HOUSING AND ELECTRONIC DEVICE

(71) Applicant: Panasonic Intellectual Property Management Co., Ltd., Osaka (JP)

(72) Inventor: Takeshi Honda, Hyogo (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 103 days.

(21) Appl. No.: 18/538,029

(22) Filed: Dec. 13, 2023

(65) Prior Publication Data

US 2024/0215177 A1 Jun. 27, 2024

(30) Foreign Application Priority Data

Dec. 22, 2022 (JP) ................................. 2022-205419

(51) Int. Cl.
 H05K 5/00 (2025.01)
(52) U.S. Cl.
 CPC ................................. H05K 5/0047 (2013.01)
(58) Field of Classification Search
 CPC ..... H05K 5/006; H05K 5/0052; H05K 5/0047
 See application file for complete search history.

(56) References Cited

U.S. PATENT DOCUMENTS 6,307,752 B1 * 10/2001 Howard ............... H05K 7/1417
 361/752
10,063,040 B1 * 8/2018 Nagano ................... H05K 5/30

2006/0044768 A1 * 3/2006 Mizutani ................ H05K 5/006
 361/752
2007/0264851 A1 * 11/2007 Honda ................. H01R 13/521
 439/157
2012/0262892 A1 * 10/2012 Kanou ................. H05K 5/0052
 29/829
2019/0313538 A1 * 10/2019 Watanabe ............ H05K 5/0052
2022/0345552 A1 * 10/2022 Wu ..................... H04M 1/0202
2022/0386454 A1 * 12/2022 Maruyama ........... H05K 3/0094

FOREIGN PATENT DOCUMENTS

JP 2002-134963 5/2002
JP 2002134963 A * 5/2002
KR 2018005000 A * 1/2018 ........... H05K 5/0052

OTHER PUBLICATIONS

Machine Translation for JP-2002134963-A (Year: 2025).*

* cited by examiner

*Primary Examiner* — Allen L Parker
*Assistant Examiner* — Peter Krim
(74) *Attorney, Agent, or Firm* — Greenblum & Bernstein, P.L.C.

(57) ABSTRACT

A housing that is to house a circuit board includes: a box component that includes an opening on a side facing the circuit board that is housed; and a lid component that closes the opening of the box component. The box component includes a box-side frame portion, the lid component includes a lid-side frame portion, and when the lid component is attached to the box component, the box-side frame portion and the lid-side frame portion combine into a loop shape to configure a frame portion that corresponds to an outer peripheral shape of an exposed component that is attached to the circuit board and exposed from the housing.

18 Claims, 8 Drawing Sheets

FIG. 1

HOUSING AND ELECTRONIC DEVICE

CROSS REFERENCE TO RELATED APPLICATION

The present application is based on and claims priority of Japanese Patent Application No. 2022-205419 filed on Dec. 22, 2022.

FIELD

The present disclosure relates to a housing and an electronic device that includes the housing.

BACKGROUND

As a technique for fixing a circuit board provided in an electronic device to the inside of a housing, Patent Literature (PTL) 1 describes a sliding-type housing technique in which a circuit board is housed by inserting it through an opening provided on a side of a rectangular-cuboid housing. The circuit board is guided by grooves provided on the inside of the housing that extend in an insertion direction, and the circuit board is fixed to the inside of the housing by press-fitting an end of the circuit board into protrusions deep inside the housing.

CITATION LIST

Patent Literature

PTL 1: Japanese Unexamined Patent Application Publication No. 2002-134963

SUMMARY

However, the technique described in PTL 1 can be improved upon.

The present disclosure provides a housing and an electronic device that can further improve upon the related art.

A housing according to one aspect of the present disclosure is a housing that is to house a circuit board, and the housing includes: a box component that includes an opening on a side facing the circuit board that is housed; and a lid component that closes the opening of the box component, wherein the box component includes a box-side frame portion, the lid component includes a lid-side frame portion, and when the lid component is attached to the box component, the box-side frame portion and the lid-side frame portion combine into a loop shape to configure a frame portion that corresponds to an outer peripheral shape of an exposed component that is attached to the circuit board and exposed from the housing.

Furthermore, an electronic device according to one aspect of the present disclosure includes: a circuit board; and a housing that is to house the circuit board, wherein the housing includes: a box component that includes an opening on a side facing the circuit board that is housed; and a lid component that closes the opening of the box component, the box component includes a box-side frame portion, the lid component includes a lid-side frame portion, and when the lid component is attached to the box component, the box-side frame portion and the lid-side frame portion combine into a loop shape to configure a frame portion that corresponds to an outer peripheral shape of an exposed component that is attached to the circuit board and exposed from the housing.

According to the present disclosure, the housing is of a vertical assembly type in which the box component and the lid component are attached to each other in a thickness direction of the circuit board. By dividing the frame portion that corresponds to the external shape of the exposed component in the thickness direction, and disposing the portions of the divided frame portion in the box component and the lid component, respectively, the gap between the exposed component and the housing can be minimized.

BRIEF DESCRIPTION OF DRAWINGS

These and other advantages and features of the present disclosure will become apparent from the following description thereof taken in conjunction with the accompanying drawings that illustrate a specific embodiment of the present disclosure.

FIG. 1 is a perspective view illustrating an electronic device that includes a housing.

DESCRIPTION OF EMBODIMENTS

Figure 2:
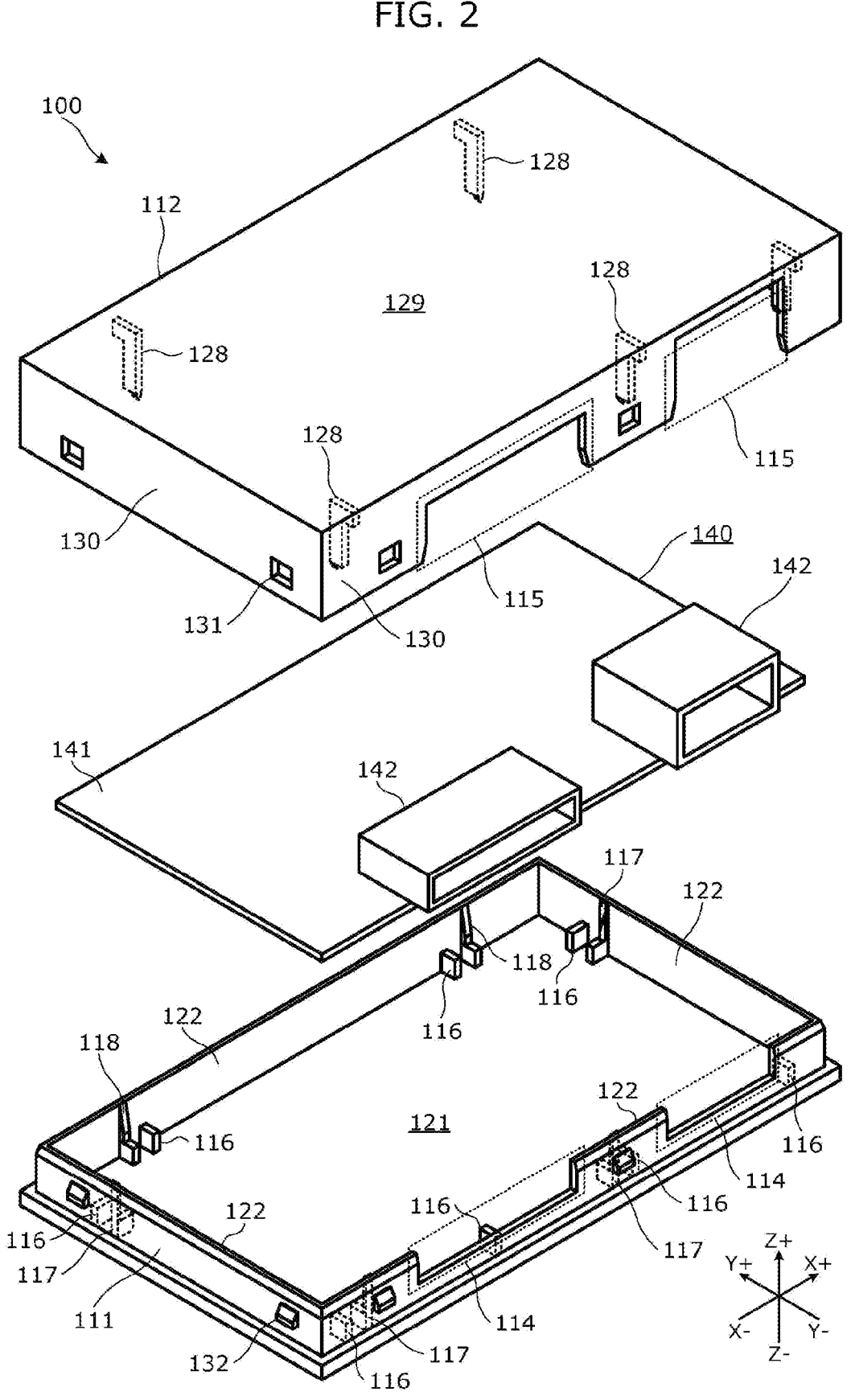
FIG. 2 is a partially see-through perspective view illustrating the electronic device in a disassembled state.

Hereinafter embodiments of a housing and an electronic device according to the present disclosure will be described with reference to the drawings. It should be noted that the following embodiments are merely examples for describing the present disclosure, and are not intended to limit the scope of the present disclosure. For example, the shapes, structures, materials, elements, relative positional relationships, connection states, numerical values, formulas, and details of each of the steps and the order of the steps of the methods, and the like, described in the following embodiments are mere examples, and may include details that are not included in the following descriptions. Furthermore, although there are cases where geometric expressions, such as "parallel" and "orthogonal", are used, these expressions are not mathematically precise indications and include substantially permissible error, deviation, and the like. Moreover, expressions, such as "simultaneous" and "identical (or the same)", are considered to cover a substantially permissible range of meaning.

Additionally, the drawings are schematic illustrations, which may include emphasis, omission, or adjustment of proportion as necessary for the purpose of illustrating the present disclosure, and thus the shapes, positional relationships, and proportions shown may be different from actuality. Furthermore, an X-axis, Y-axis, and Z-axis, which may be shown in the figures indicate orthogonal coordinates that have been set in an arbitrary manner for the purpose of describing the figures. That is to say, a Z-axis is not necessarily an axis that extends in a vertical direction, and X and Y axes do not necessarily lie within a horizontal plane.

Furthermore, hereinafter, multiple aspects may be comprehensively described as a single embodiment. Moreover, part of the contents in the description below describes optional elements related to the present disclosure.

As a technique for fixing a circuit board provided in an electronic device to the inside of a housing, a sliding-type housing technique in which a circuit board is housed by inserting the circuit board through an opening provided on a side of a rectangular-cuboid housing exists. The circuit board is guided by grooves provided on the inside of the housing that extend in an insertion direction, and the circuit board is fixed to the inside of the housing by press-fitting an end of the circuit board into protrusions deep inside the housing.

However, with the sliding-type housing method, the opening of the housing needs to be at least as large as the largest component (e.g., a connector) that is attached to the circuit board. If the opening of the housing is large, a large gap will be formed between the circuit board that is housed and the housing, and the risk of water or a foreign object entering the housing will increase.

Furthermore, although a spacer or the like could be used to fill in the gap between the circuit board and the housing, this will increase the number of components used in the electronic device, thereby resulting in increased man-hours when performing assembly of the electronic device.

Hereinafter, a housing for which a gap between the housing and a circuit board housed in the housing can be minimized, and an electronic device that includes the housing will be described.

Figure 1:
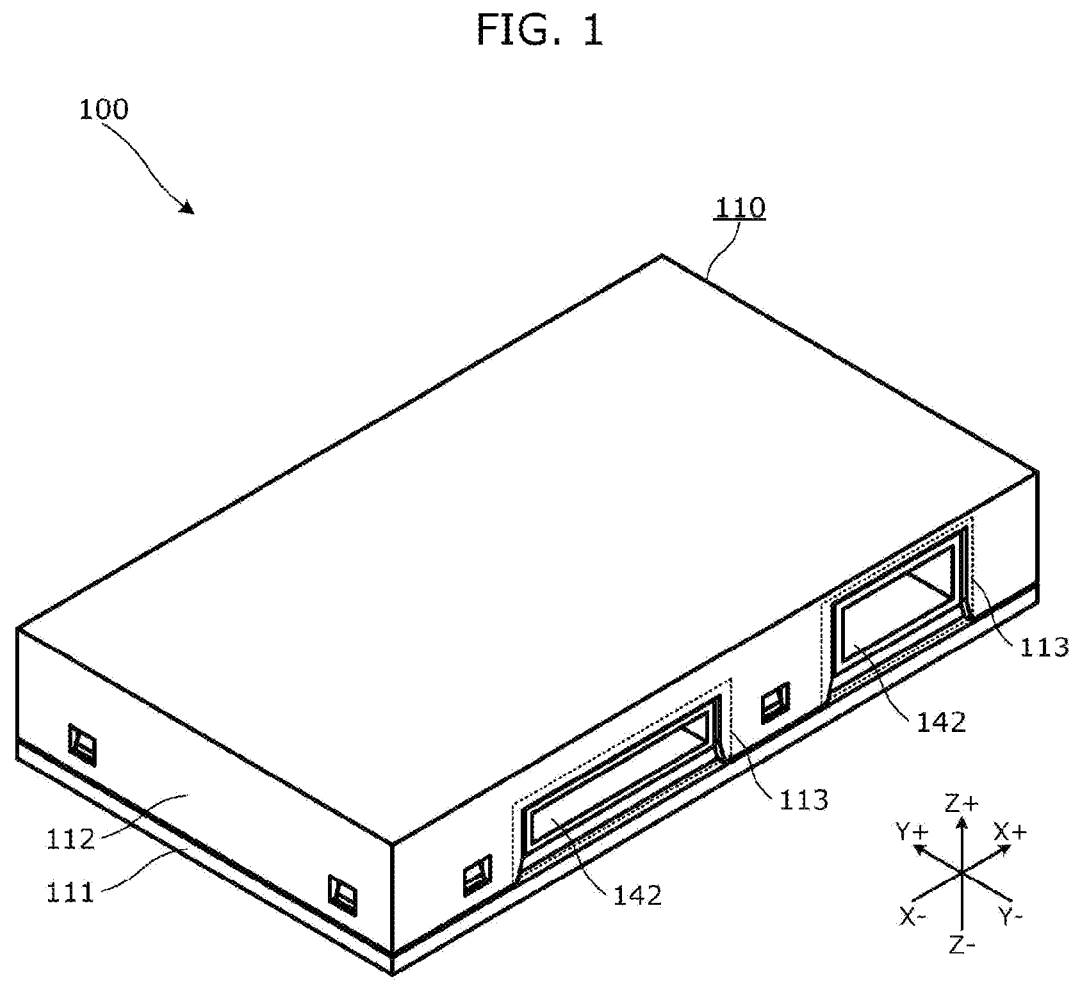

FIG. 1 is a perspective view illustrating electronic device 100 that includes housing 110. FIG. 2 is a partially see-through perspective view illustrating electronic device 100 in a disassembled state. Electronic device 100 includes circuit board 140 that implements the functions of electronic device 100 and housing 110 that houses circuit board 140. Electronic device 100 is attached to an object, such as a moving body, including, for example, an automobile, aircraft, or a marine vessel, and examples of electronic device 100 include an electronic control unit (ECU) that electronically controls all or part of the functions of the object to which electronic device 100 is attached, an audio amplifier, or the like.

Circuit board 140 includes printed substrate 141 on which substrate wiring is provided and components, such as electronic components and electrical components (omitted from the figures), that are attached to printed substrate 141 to implement the functions of electronic device 100. Circuit board 140 includes exposed components 142, such as connectors or the like, which are one example of components that are partially exposed from housing 110, in order to allow external communication, the supplying of power, the obtaining of a signal from a sensor, and the like. In the present embodiment, two exposed components 142 are attached to circuit board 140.

Although the shape of circuit board 140 is not particularly limited, in the present embodiment, the shape is a rectangular-board shape. Note that when directions are described in the present Description, terms such as a thickness direction of circuit board 140 (Z-axis direction in the figures), a lengthwise direction of circuit board 140 (X-axis direction in the figures), and a lateral direction of circuit board 140 (Y-axis direction in the figures) may be used.

Housing 110 is a box-shaped component that houses circuit board 140, and includes box component 111, lid component 112, and frame portions 113. The approximate external shape of housing 110 is not particularly limited, and may be a rectangular cuboid, a cylinder, or the like. In the present embodiment, housing 110 is approximately rectangular-cuboid shaped to correspond to the shape of circuit board 140.

Examples of the material of housing 110 include acrylonitrile butadiene styrene (ABS), ABS containing polycarbonate (PC) as an additive, acrylonitrile styrene acrylate (ASA), styrene acrylonitrile (SAN), and polypropylene (PP). Furthermore, glass fiber, and the like, may be included as a reinforcing material. Additionally, the material of housing 110 may be adjusted to have a hardness (softness) that allows first deformable portions 133 and second deformable portions 124 (later described in detail) that are integrally formed with housing 110 to be deformed by being scraped away or crushed by circuit board 140. The elasticity of the specific material of housing 110 may, for example, be 2,000 MPa to 2,500 MPa. This elasticity may be achieved by adjusting the amount of additives, such as butadiene, acrylate rubber, and the like.

Box component 111 is a box-shaped component that is open on the side facing circuit board 140 that is housed. Box component 111 includes box-side frame portions 114 each of which constitutes a portion of a corresponding frame portion 113 that is loop shaped to correspond to the outer peripheral shape of a corresponding exposed component 142. In the present embodiment, since exposed components 142 are rectangular-cuboid in shape, each of frame portions 113 is a portion that surrounds a rectangular penetrating hole, and each of box-side frame portions 114 is a portion that surrounds a rectangular notch. It should be noted that box-side frame portions 114 are part of box component 111, and the boundaries of box-side frame portions 114 are not clearly defined. In the present embodiment, box component 111 includes box-side protrusions 116, protruding strip portions 117, and stoppers 118.

Each box-side protrusion 116 is a portion that has a leading end that abuts one side of circuit board 140 that is housed, and restricts movement of circuit board 140 in the thickness direction of circuit board 140 that is housed (Z-axis direction in the figures), when lid component 112 is attached to box component 111. In the present embodiment, each box-side protrusion 116 is a rectangular-cuboid shaped protrusion provided in a projecting manner at a corner between box-side main surface 121 that is the largest surface of box component 111 and one of the four box-side wall portions 122 that intersect with box-side main surface 121. Each of the plurality of box-side protrusions 116 is disposed such that the surfaces of box-side protrusions 116 facing the opening (Z+ side in the figures) are level with each other, and support edge portions of circuit board 140.

Figure 3:
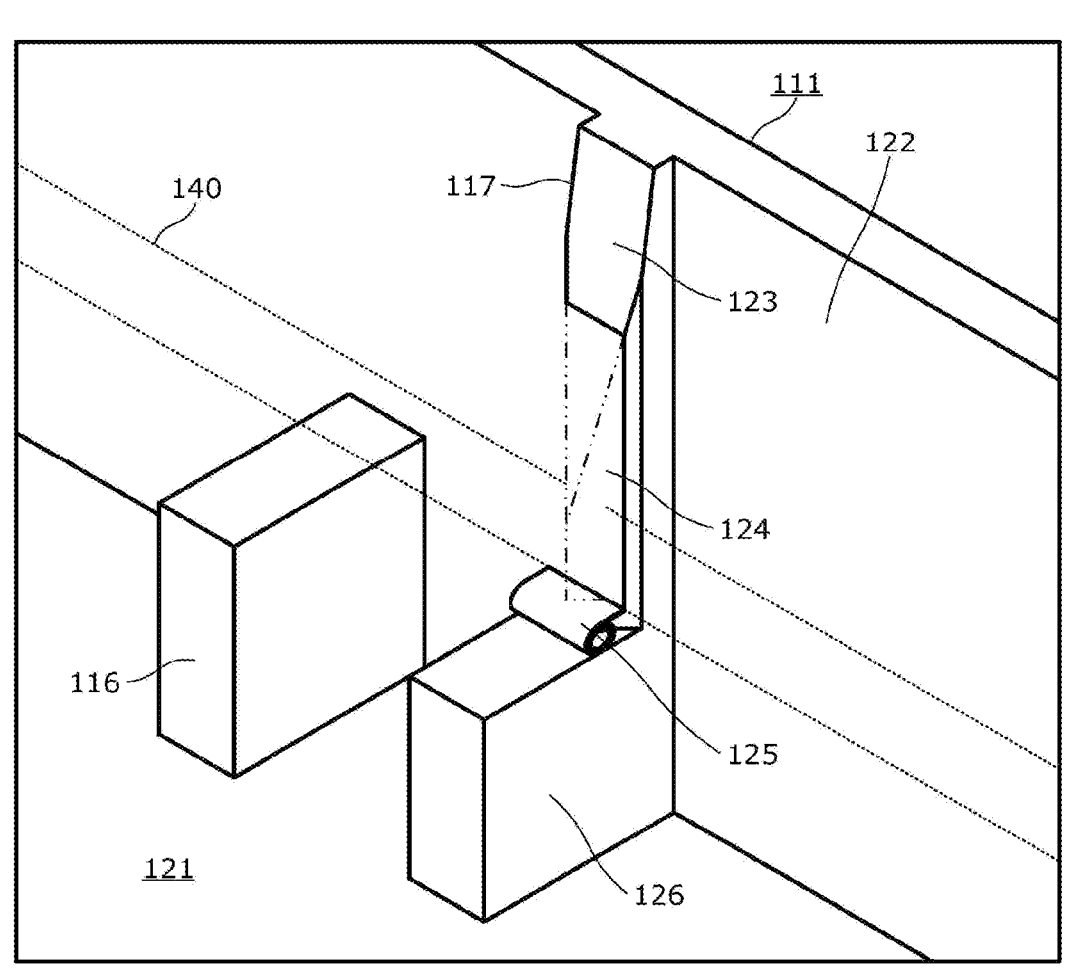
FIG. 3 is a perspective view illustrating the vicinity of a protruding strip that has been scraped away by a circuit board.
Figure 3:
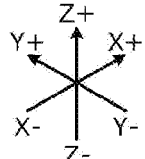

FIG. 3 is a perspective view illustrating the vicinity of a protruding strip portion 117 that has been scraped away by circuit board 140. In FIG. 3, two-dot chain lines indicate the portion that has been scraped away. Protruding strip portion 117 is a rib-shaped portion of box component 111 that projects from one of opposing wall portions (e.g., box-side wall portion 122 on the X+ side in the figure) toward the other wall portion (e.g., box-side wall portion 122 on the X– side in the figure), and extends in the thickness direction (Z-axis direction in the figure). Protruding strip portion 117 restricts movement of circuit board 140 in the lengthwise direction (X-axis direction in the figure) or the lateral direction (Y-axis direction in the figure) orthogonal to the thickness direction of circuit board 140 that is housed. In the present embodiment, each protruding strip portion 117 is provided in a rib-shape at a corner between box-side main surface 121 and a box-side wall portion 122, and includes tapered surface 123 and second deformable portion 124. Inside of box component 111, protruding strip portions 117 are disposed across from each other on both sides in the lengthwise direction, and are disposed on one side in the lateral direction in the vicinity of box-side frame portions 114.

Tapered surface 123 is a surface that is angled to approach the other wall portion on the opposite side (e.g., box-side wall portion 122 on the X– side in the figure) with distance from the opening on the side closer to lid component 112, that is to say, with proximity to box-side main surface 121, in the thickness direction. Tapered surface 123 is a portion that abuts an edge of circuit board 140 when circuit board 140 is being positioned in box component 111, and guides circuit board 140 when circuit board 140 is being press-fitted to box component 111.

Second deformable portion 124 is a portion that extends from tapered surface 123 toward the box-side main surface 121 on the side opposite of the opening (of box component 111), and becomes deformed by circuit board 140 being press-fitted. Second deformable portion 124 includes an edge that thins out toward the leading end approaching the other wall portion (e.g., box-side wall portion 122 on the X– side in the figure), and can easily be deformed during press-fitting of circuit board 140. Before being deformed, a portion of second deformable portion 124 is disposed in tapered surface 123. In the present embodiment, second deformable portion 124 is deformed by being scraped away by an edge portion of circuit board 140 during press-fitting. Shavings 125 generated by second deformable portion 124 being scraped away are held between circuit board 140 and base portion 126 that is lower than box-side protrusion 116. It should be noted that second deformable portion 124 may undergo plastic deformation without being scraped away.

Protruding strip portion 117 securely restricts the movement of circuit board 140 in a direction orthogonal to the thickness direction by second deformable portion 124 being deformed in a manner in which no gap is created, even when an error in at least one of the lengths of the lengthwise direction or the lateral direction of circuit board 140 is large.

Figure 4:
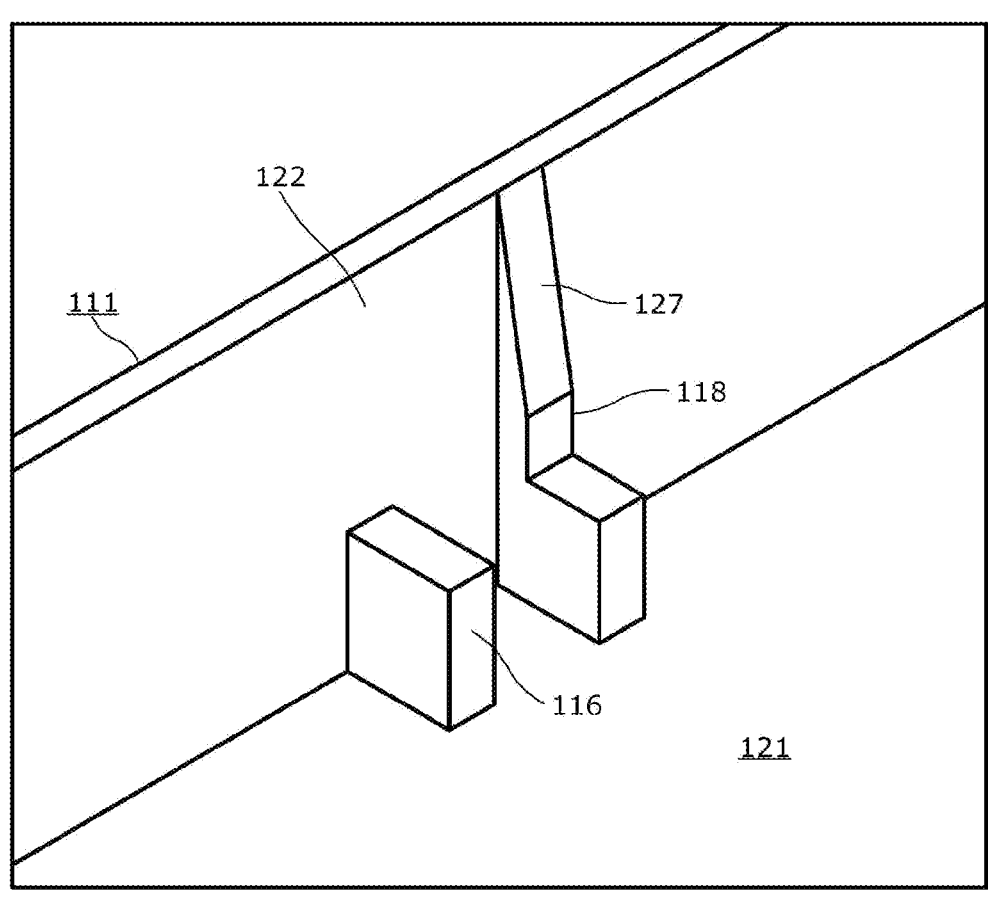
FIG. 4 is a perspective view illustrating the vicinity of a stopper.
Figure 4:
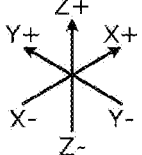

FIG. 4 is a perspective view illustrating the vicinity of stopper 118. Stopper 118 is a rib-shaped portion of box component 111 that projects from one of opposing wall portions (e.g., box-side wall portion 122 on the Y+ side in the figure) toward the other wall portion (e.g., box-side wall portion 122 on the Y– side in the figure), and extends in the thickness direction (Z-axis direction in the figure). Stopper 118 restricts movement of circuit board 140 in the lateral direction (Y-axis direction in the figure) orthogonal to the thickness direction of circuit board 140 that is housed. In the present embodiment, stoppers 118 are provided in a rib-shape at corner portions between box-side main surface 121 and a box-side wall portion 122, and each stopper 118 includes second tapered surface 127. Stoppers 118 are disposed across from protruding strip portions 117 in the lateral direction.

Second tapered surface 127 is a surface that is angled to approach the other wall portion on the opposite side (e.g., box-side wall portion 122 on the Y– side in the figure) with distance from the opening on the side closer to lid component 112, that is to say, with proximity to box-side main surface 121, in the thickness direction. Second tapered surface 127 abuts an edge of circuit board 140 when circuit board 140 is being positioned in box component 111, and guides circuit board 140 when circuit board 140 is being press-fitted to box component 111.

Lid component 112 is a component that closes the opening of box component 111. Lid component 112 includes lid-side frame portions 115 each of which constitutes a portion of a corresponding frame portion 113 that is loop shaped to correspond to the outer peripheral shape of a corresponding exposed component 142. In the present embodiment, each lid-side frame portion 115 is a portion that surrounds a rectangular notch, and constitutes a portion of a corresponding, rectangular, penetrating frame portion 113 by being assembled together with a corresponding box-side frame portion 114. It should be noted that lid-side frame portions 115 are part of lid component 112, and the boundaries of lid-side frame portions 115 are not clearly defined. In the present embodiment, lid component 112 includes lid-side protrusions 128.

Lid component 112 is not limited to any particular shape. In the present embodiment, lid component 112 is shaped to form a mated structure with box component 111. Lid component 112 includes lid-side main surface 129 that is the largest surface of lid component 112 and four lid-side wall portions 130 that intersect with lid-side main surface 129. Lid-side wall portions 130 are disposed outward of box-side wall portions 122. Lid-side wall portions 130 have engagement holes 131 that extend in the lengthwise direction and the lateral direction at a plurality of locations. Together with engagement protrusions 132 provided at a plurality of locations on the outer peripheral surfaces of box-side wall portions 122, engagement holes 131 form snap fitting structures that fix lid component 112 and box component 111. By providing snap fitting structures formed between engagement holes 131 and engagement protrusions 132 on the outside of box component 111, a large space for housing circuit board 140 can be secured in box component 111. Stated differently, circuit board 140 that is housed in housing 110 can be made larger, and a larger area for mounting components onto circuit board 140 can be secured.

Figure 5:
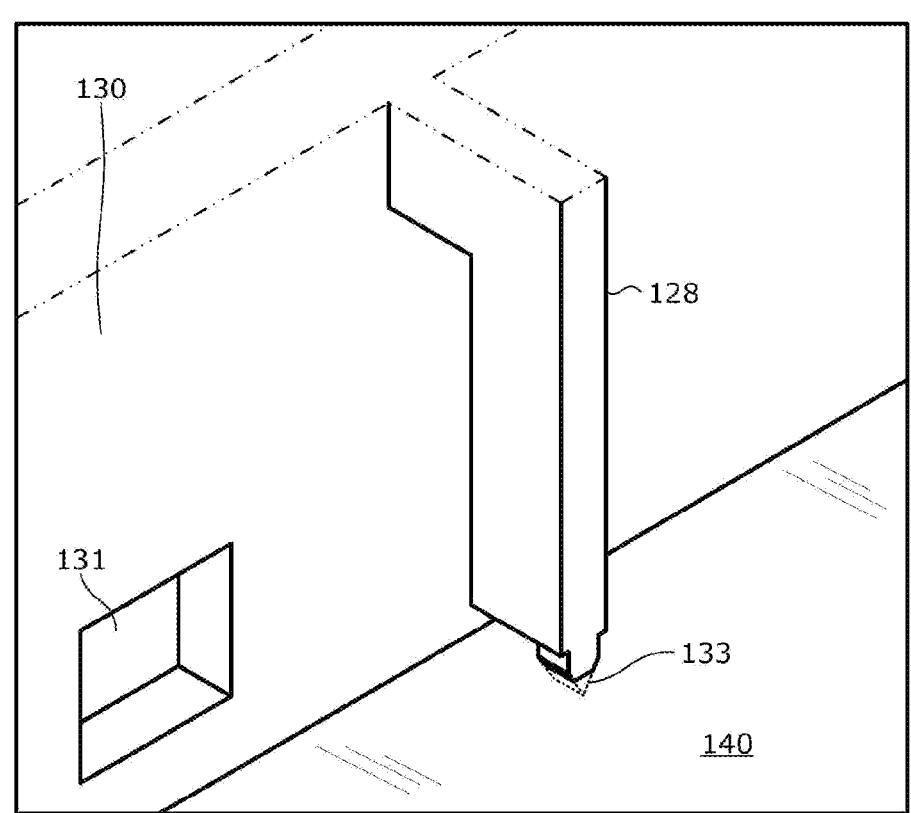
FIG. 5 is a perspective view illustrating the vicinity of a lid-side protrusion with a lid-side main surface omitted.
Figure 5:
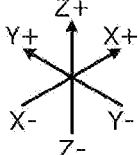

FIG. 5 is a perspective view illustrating the vicinity of lid-side protrusion 128 from which lid-side main surface 129 is omitted. In FIG. 5, a portion that has been deformed by being pressed against circuit board 140 is indicated by dashed lines. Each lid-side protrusion 128 is a portion that has a leading end that abuts one side of circuit board 140 that is housed when lid component 112 is attached to box component 111. Lid-side protrusion 128 holds circuit board 140 between lid-side protrusion 128 and a corresponding box-side protrusion 116 in the thickness direction of circuit board 140 that is housed (Z-axis direction in the figure) to thereby restrict movement of circuit board 140. In the present embodiment, lid-side protrusion 128 is a rectangular-cuboid shaped protrusion provided in a manner projecting from lid-side main surface 129 toward box component 111 in the thickness direction. In the present embodiment, a first deformable portion 133 that becomes deformed by being pressed against the surface of circuit board 140 when lid component 112 is attached to box component 111 is provided on the leading end of each of the lid-side protrusions 128. Before being deformed, first deformable portion 133 is of a wedge or needle shape that is pointed toward circuit board 140. When attaching lid component 112 to box component 111, first deformable portion 133 is pressed against circuit board 140 in the thickness direction and becomes crushed. After being crushed, first deformable portion 133 abuts and is brought into surface-to-surface contact with circuit board 140.

Figure 6:
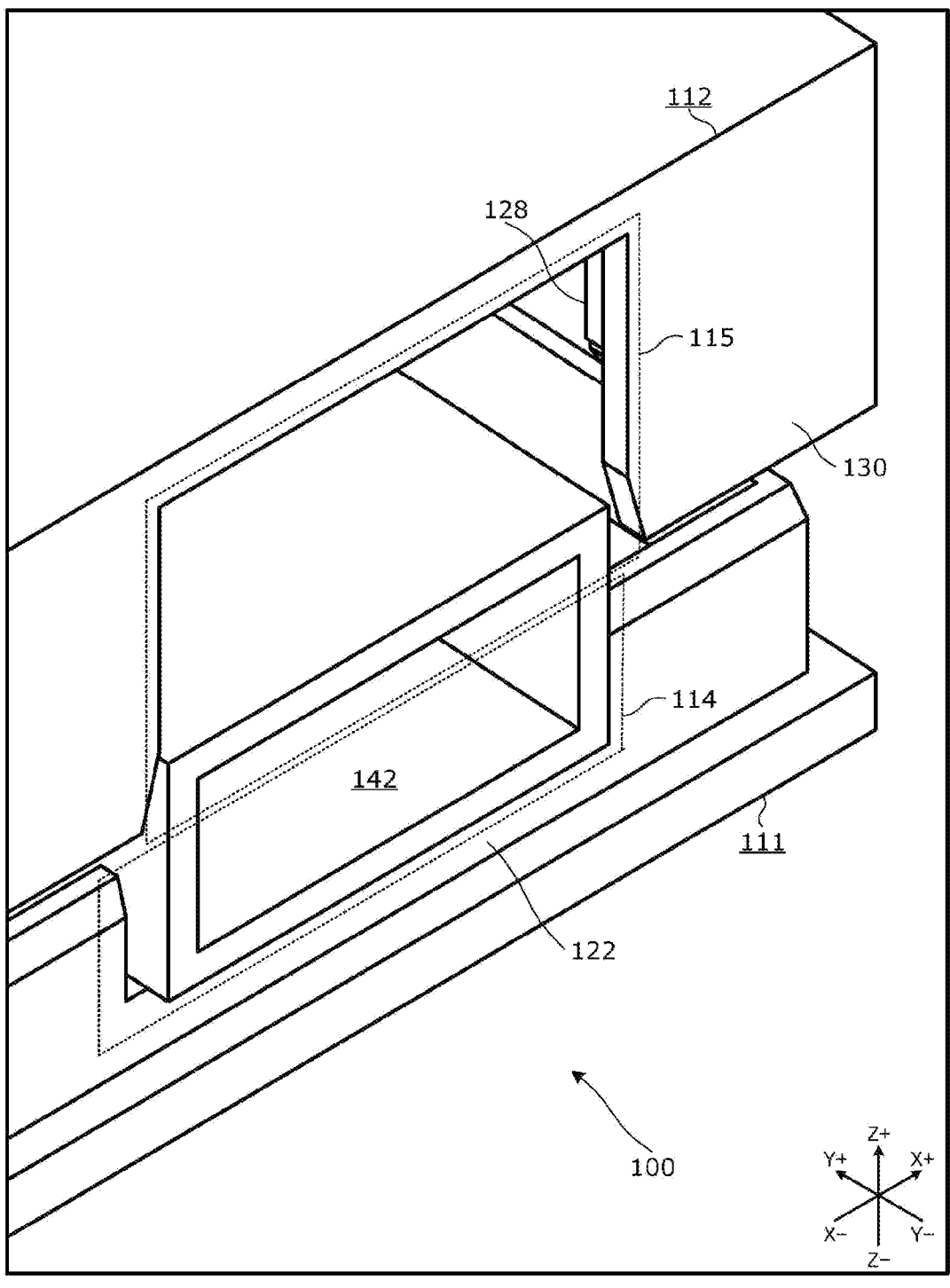
FIG. 6 is a perspective view illustrating the vicinity of a frame portion before assembly is performed.
Figure 7:
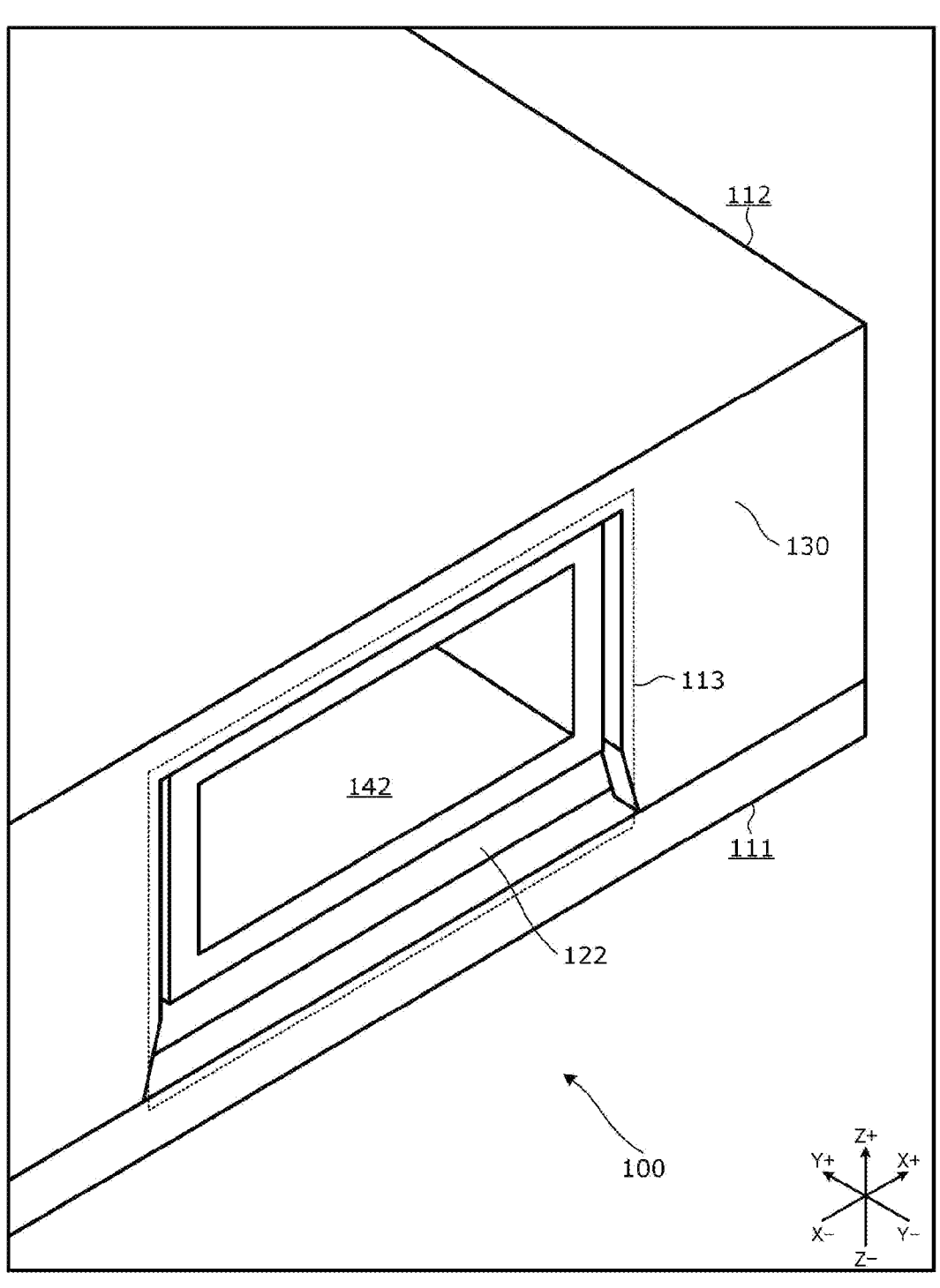
FIG. 7 is a perspective view illustrating the vicinity of the frame portion after assembly is performed.

FIG. 6 is a perspective view illustrating the vicinity of frame portion 113 before assembly is performed. FIG. 7 is a perspective view illustrating the vicinity of frame portion 113 after assembly is performed. Each frame portion 113 is a portion from which a corresponding exposed component 142, which is one of the components attached to circuit board 140, is exposed from housing 110. Each frame portion 113 is in a shape that corresponds to the outer peripheral shape of the corresponding exposed component 142. A state where a shape corresponds to the outer peripheral shape of a corresponding exposed component 142 refers to a state where frame portion 113 closely follows or abuts the outer peripheral surface of the corresponding exposed component 142, and includes a case where there is only a small gap between frame portion 113 and the corresponding exposed component 142. Furthermore, a state where a shape corresponds to the outer peripheral shape of the corresponding exposed component 142 refers to a state where water, a minute foreign object, or the like, can be prevented from entering housing 110 from in between frame portion 113 and the corresponding exposed component 142. As illustrated in FIG. 6, frame portion 113 can be separated into box-side frame portion 114 and lid-side frame portion 115, and as illustrated in FIG. 7, box-side frame portion 114 and lid-side frame portion 115 form a loop-shaped frame portion 113 when lid component 112 is attached to box component 111. In the present embodiment, box-side frame portion 114 is disposed inward of lid-side frame portion 115, and when lid component 112 is attached to box component 111, box-side frame portion 114 and lid-side frame portion 115 form frame portion 113 by overlapping each other in the lateral direction.

With housing 110 of electronic device 100 according to the embodiment, box component 111 that includes box-side frame portions 114 and lid component 112 that includes lid-side frame portions 115 are attached in the thickness direction of circuit board 140 that is housed, thereby making it possible to dispose corresponding ones of box-side frame portions 114 and lid-side frame portions 115 in such a way that they surround the outer peripheral surface of a corresponding one of exposed components 142. Accordingly, each frame portion 113 can be disposed such that there is no gap or only a small gap with the outer peripheral surface of a corresponding exposed component 142 without being affected by unevenness on the outer peripheral surface of exposed component 142 or the size of each component mounted on circuit board 140 other than exposed components 142, thereby effectively preventing water or a foreign object from entering through a gap.

Furthermore, due to the force applied when attaching lid component 112 to box component 111, first deformable portions 133 provided at the leading ends of lid-side protrusions 128 are pressed against circuit board 140 until they are in surface-to-surface contact with a surface of circuit board 140, and circuit board 140 is held between lid-side protrusions 128 and box-side protrusions 116, thereby making it possible to firmly fix circuit board 140 inside of housing 110.

Additionally, due to the force applied when attaching lid component 112 to box component 111, circuit board 140 is press-fitted between opposing protruding strip portions 117, and between protruding strip portions 117 and stoppers 118, thereby causing second deformable portions 124 to become deformed. Accordingly, even in a case where there is a manufacturing error in the distance between opposing protruding strip portions 117, the distance between protruding strip portions 117 and stoppers 118, or the dimensions of circuit board 140, protruding strip portions 117 and stoppers 118 can securely hold circuit board 140 in directions orthogonal to the thickness direction.

It should be noted that the present disclosure is not limited to the above embodiment. For example, other embodiments produced by arbitrarily combining or omitting some elements described in the present Description may be included as embodiments of the present disclosure. Moreover, the present disclosure includes variations obtained by various modifications to the above embodiment that can be conceived by those skilled in the art, so long as they do not depart from the essence of the present disclosure, that is, the intended meaning of the appended Claims.

Figure 8:
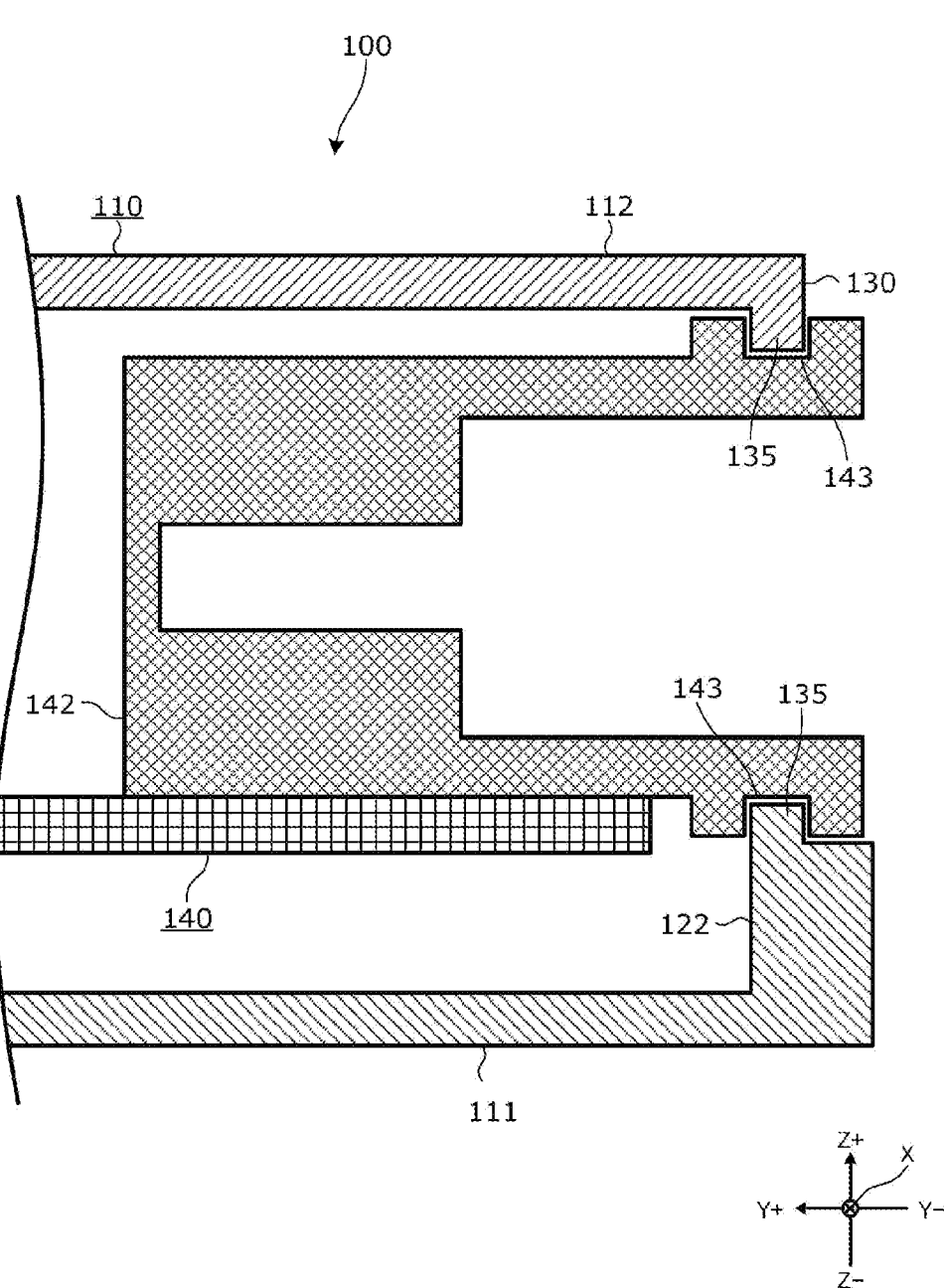
FIG. 8 is a cross-sectional view of another example of the housing.

For example, as illustrated in FIG. 8, frame portion 113 may include fitting portions 135 that mate with recessed portions 143 that are grooves or holes that extend along the wall portion of housing 110 from which exposed components 142 are exposed and are provided in the outer peripheral surface of exposed components 142. Since each frame portion 113 can be divided into box-side frame portion 114 and lid-side frame portion 115, fitting portions 135 that extend along box-side wall portion 122 and lid-side wall portion 130 can be inserted into recessed portions 143 that extend in the same manner. Accordingly, water, a foreign object, or the like can effectively be prevented from entering housing 110.

FURTHER INFORMATION ABOUT TECHNICAL BACKGROUND TO THIS APPLICATION

The disclosure of the following patent application including specification, drawings, and claims is incorporated herein by reference in its entirety: Japanese Patent Application No. 2022-205419 filed on Dec. 22, 2022.

The invention claimed is:

1. A housing that is to house a circuit board, the housing comprising:
    a box component that includes an opening on a side facing the circuit board that is housed; and
    a lid component that closes the opening of the box component, wherein
    the box component includes a box-side frame portion,
    the lid component includes a lid-side frame portion,
    when the lid component is attached to the box component, the box-side frame portion and the lid-side frame portion combine into a loop shape to configure a frame portion that corresponds to an outer peripheral shape of an exposed component that is attached to the circuit board and exposed in a first direction from the housing,
    the box-side frame portion includes a first box-side wall portion intersecting with a box-side main surface which is the largest surface of the box component,
    the lid-side frame portion includes a first lid-side wall portion intersecting with a lid-side main surface which is the largest surface of the lid component,
    the first box-side wall portion and the first lid-side wall portion overlap each other in the first direction,
    the box component includes four box-side wall portions that includes the first box-side wall portion, extending from the box-side main surface in a thickness direction of the circuit board, and intersecting with the box-side main surface,
    the four box-side wall portions includes a second box-side wall portion facing the first box-side wall portion,
    the first box-side wall portion includes a first protruding strip portion that projects from the first box-side wall portion toward the second box-side wall portion and extends in the thickness direction of the circuit board, the first box-side wall portion further includes a box-side protrusion that supports the circuit board by contacting, when the circuit board is accommodated, a circuit board main surface which is a largest surface of the circuit board, the first protruding strip portion includes:

a first tapered surface that is inclined so as to approach the second box-side wall portion as the first tapered surface extends away from the opening;

a base portion having a planar surface located at a position lower than the box-side protrusion in a height direction corresponding to the thickness direction of the circuit board;

a first connecting portion extending from the first tapered surface toward the base portion along the thickness direction of the circuit board; and a second deformable portion that is a part of the first tapered surface, extends from the first box-side wall portion toward the box-side main surface, and is deformable by press-fitting of the circuit board, the second box-side wall portion includes a second protruding strip portion that projects from the second box-side wall portion toward the first box-side wall portion and extends in the thickness direction of the circuit board, the second protruding strip portion includes:

a second tapered surface that is inclined so as to approach the first box-side wall portion as the second tapered surface extends away from the opening;

a stopper portion having a planar surface located at a position lower than the box-side protrusion in the height direction; and a second connecting portion extending from the second tapered surface toward the planar surface of the stopper portion along the thickness direction of the circuit board, a first protrusion length is a length, in a first state in which the circuit board is not accommodated, from the first box-side wall portion on which the first protruding strip portion is provided to a point on the first tapered surface farthest from the first box-side wall portion, a second protrusion length is a length, in a second state in which the circuit board is accommodated, from the first box-side wall portion on which the first protruding strip portion is provided to a point on the first tapered surface farthest from the first box-side wall portion after deformation by the circuit board, a third protrusion length is a length from the second box-side wall portion on which the second protruding strip portion is provided to a point on the second tapered surface farthest from the second box-side wall portion, and the third protrusion length is shorter than the first protrusion length.

2. The housing according to claim 1, wherein the box component includes a box-side protrusion including a leading end that abuts one surface of the circuit board, the lid component includes a lid-side protrusion including a leading end that abuts another surface of the circuit board, and the box-side protrusion and the lid-side protrusion hold the circuit board in a thickness direction of the circuit board when the lid component is attached to the box component.

3. The housing according to claim 2, wherein one of the box-side protrusion or the lid-side protrusion includes, in the leading end, a first deformable portion that deforms when the lid component is attached to the box component.

4. The housing according to claim 1, wherein the frame portion includes a fitting portion that mates with a groove or a hole that is provided in an outer peripheral surface of the exposed component and extends along a wall portion of the housing from which the exposed component is exposed.

5. The housing according to claim 1, wherein a material of the housing includes at least one of acrylonitrile butadiene styrene (ABS), acrylonitrile styrene acrylate (ASA), styrene acrylonitrile (SAN), or polypropylene (PP).

6. The housing according to claim 5, wherein the material includes a reinforcing material.

7. The housing according to claim 1, wherein elasticity of a material of the housing is selected from a range of from 2,000 MPa to 2,500 MPa, inclusive.

8. The housing according to claim 1, wherein the lid component includes four lid-side wall portions that include the first lid-side wall portion, extending from the lid-side main surface in the thickness direction of the circuit board, and intersecting with the lid-side main surface, and the frame portion includes:

a first fitting portion that mates with a first groove provided in an outer peripheral surface of the exposed component on a side of the box component and extending along the first box-side wall portion from which the exposed component is exposed; and a second fitting portion that mates with a second groove provided in the outer peripheral surface of the exposed component on a side of the lid component and extending along the first lid-side wall portion from which the exposed component is exposed.

9. The housing according to claim 1, wherein the circuit board is in surface contact with the box-side protrusion and is spaced apart from the base portion.

10. The housing according to claim 1, wherein the box component includes a box-side protrusion including a first leading end that abuts one surface of the circuit board, the lid component includes a lid-side protrusion including a second leading end that abuts another surface of the circuit board, the lid-side protrusion is provided with a first deformable portion at the second leading end, the first deformable portion having a wedge or needle shape toward the circuit board, and the first deformable portion is configured to be deformed from a state of point contact or line contact with the circuit board to a state of surface contact with the circuit board by being pressed against the circuit board in the thickness direction of the circuit board.

11. The housing according to claim 1, wherein a first height is a length, in the second state in which the circuit board is accommodated, from the base portion to a point on the first tapered surface that is closest to the base portion after the deformation by the circuit board, a second height is a length from the planar surface of the stopper portion to a point on the second tapered surface that is closest to the planar surface of the stopper portion, and the second height is shorter than the first height.

12. The housing according to claim 1, wherein
the second protruding strip portion does not include a
deformable portion that is deformable by the press-
fitting of the circuit board.

13. The housing according to claim 1, wherein
the first protruding strip portion is provided in a greater
number than the second protruding strip portion.

14. The housing according to claim 1, wherein
a first distance is a distance from a point on the first
tapered surface closest to the opening to the first
box-side wall portion,
a second distance is a distance from a point on the second
tapered surface closest to the opening to the second
box-side wall portion, and
the first distance is longer than the second distance.

15. The housing according to claim 1, wherein
the first protruding strip portion includes an intermediate
portion between the first tapered surface and the first
box-side wall portion, the intermediate portion having
a planar surface parallel to the circuit board main
surface.

16. The housing according to claim 1, wherein
the first protruding strip portion is disposed to face the
second protruding strip portion in a lateral direction of
the circuit board.

17. An electronic device comprising:
a circuit board; and
a housing that is to house the circuit board, wherein
the housing includes:
    a box component that includes an opening on a side
        facing the circuit board that is housed; and
    a lid component that closes the opening of the box
        component,
the box component includes a box-side frame portion,
the lid component includes a lid-side frame portion,
when the lid component is attached to the box component,
    the box-side frame portion and the lid-side frame
    portion combine into a loop shape to configure a frame
    portion that corresponds to an outer peripheral shape of
    an exposed component that is attached to the circuit
    board and exposed in a first direction from the housing,
the box-side frame portion includes a box-side wall
    portion intersecting with a box-side main surface which
    is the largest surface of the box component,
the lid-side frame portion includes a lid-side wall portion
    intersecting with a lid-side main surface which is the
    largest surface of the lid component,
the box-side wall portion and the lid-side wall portion
    overlap each other in the first direction,
the box component includes four box-side wall portions
    that includes the first box-side wall portion, extending
    from the box-side main surface in a thickness direction
    of the circuit board, and intersecting with the box-side
    main surface,
the four box-side wall portions includes a second box-side
    wall portion facing the first box-side wall portion,
the first box-side wall portion includes a first protruding
    strip portion that projects from the first box-side wall
    portion toward the second box-side wall portion and
    extends in the thickness direction of the circuit board,
the first box-side wall portion further includes a box-side
    protrusion that supports the circuit board by contacting,
    when the circuit board is accommodated, a circuit
    board main surface which is a largest surface of the
    circuit board, the first protruding strip portion includes:
    a first tapered surface that is inclined so as to approach
        the second box-side wall portion as the first tapered
        surface extends away from the opening;
    a base portion having a planar surface located at a
        position lower than the box-side protrusion in a
        height direction corresponding to the thickness
        direction of the circuit board;
    a first connecting portion extending from the first
        tapered surface toward the base portion along the
        thickness direction of the circuit board; and
    a second deformable portion that is a part of the first
        tapered surface, extends from the first box-side wall
        portion toward the box-side main surface, and is
        deformable by press-fitting of the circuit board,
the second box-side wall portion includes a second pro-
    truding strip portion that projects from the second
    box-side wall portion toward the first box-side wall
    portion and extends in the thickness direction of the
    circuit board,
the second protruding strip portion includes:
    a second tapered surface that is inclined so as to
        approach the first box-side wall portion as the second
        tapered surface extends away from the opening;
    a stopper portion having a planar surface located at a
        position lower than the box-side protrusion in the
        height direction; and
    a second connecting portion extending from the second
        tapered surface toward the planar surface of the
        stopper portion along the thickness direction of the
        circuit board,
    a first protrusion length is a length, in a first state in
        which the circuit board is not accommodated, from
        the first box-side wall portion on which the first
        protruding strip portion is provided to a point on the
        first tapered surface farthest from the first box-side
        wall portion,
    a second protrusion length is a length, in a second state
        in which the circuit board is accommodated, from
        the first box-side wall portion on which the first
        protruding strip portion is provided to a point on the
        first tapered surface farthest from the first box-side
        wall portion after deformation by the circuit board,
    a third protrusion length is a length from the second
        box-side wall portion on which the second protruding
        strip portion is provided to a point on the second
        tapered surface farthest from the second box-side wall
        portion, and
the third protrusion length is shorter than the first protru-
    sion length.

18. A housing that is to house a circuit board, the housing
comprising:
a box component that includes an opening on a side facing
    the circuit board that is housed; and
a lid component that closes the opening of the box
    component, wherein
the box component includes a box-side frame portion,
the lid component includes a lid-side frame portion,
when the lid component is attached to the box component,
    the box-side frame portion and the lid-side frame
    portion combine into a loop shape to configure a frame
    portion that corresponds to an outer peripheral shape of
    an exposed component that is attached to the circuit
    board and exposed in a first direction from the housing,
the box-side frame portion includes a first box-side wall
    portion intersecting with a box-side main surface which
    is the largest surface of the box component, the lid-side frame portion includes a first lid-side wall portion intersecting with a lid-side main surface which is the largest surface of the lid component, the first box-side wall portion and the first lid-side wall portion overlap each other in the first direction, the box component includes four box-side wall portions that includes the first box-side wall portion, extending from the box-side main surface in a thickness direction of the circuit board, and intersecting with the box-side main surface, the four box-side wall portions includes a second box-side wall portion facing the first box-side wall portion, the first box-side wall portion includes a first protruding strip portion that projects from the first box-side wall portion toward the second box-side wall portion and extends in the thickness direction of the circuit board, the first box-side wall portion further includes a box-side protrusion that supports the circuit board by contacting, when the circuit board is accommodated, a circuit board main surface which is a largest surface of the circuit board, the first protruding strip portion includes:

a first tapered surface that is inclined so as to approach the second box-side wall portion as the first tapered surface extends away from the opening;

a base portion having a planar surface located at a position lower than the box-side protrusion in a height direction corresponding to the thickness direction of the circuit board;

a first connecting portion extending from the first tapered surface toward the base portion along the thickness direction of the circuit board; and a second deformable portion that is a part of the first tapered surface, extends from the first box-side wall portion toward the box-side main surface, and is deformable by press-fitting of the circuit board, the second box-side wall portion includes a second protruding strip portion that projects from the second box-side wall portion toward the first box-side wall portion and extends in the thickness direction of the circuit board, the second protruding strip portion includes:

a second tapered surface that is inclined so as to approach the first box-side wall portion as the second tapered surface extends away from the opening;

a stopper portion having a planar surface located at a position lower than the box-side protrusion in the height direction; and a second connecting portion extending from the second tapered surface toward the planar surface of the stopper portion along the thickness direction of the circuit board, a first height is a length, in a state in which the circuit board is accommodated, from the base portion to a point on the first tapered surface that is closest to the base portion after deformation by the circuit board, a second height is a length from the planar surface of the stopper portion to a point on the second tapered surface that is closest to the planar surface of the stopper portion, and the second height is shorter than the first height.

* * * * *